United States Patent
Oberoi et al.

(10) Patent No.: US 12,020,961 B2
(45) Date of Patent: Jun. 25, 2024

(54) AUTOMATED ASSISTANCE IN A SEMICONDUCTOR MANUFACTURING ENVIRONMENT

(71) Applicant: Lavorro, Inc., Palo Alto, CA (US)

(72) Inventors: Akshay Oberoi, Palo Alto, CA (US); Arya Priya Bhattacherjee, Livermore, CA (US)

(73) Assignee: LAVORRO, INC., Fremont, CA (US)

(*) Notice: Subject to any disclaimer, the term of this patent is extended or adjusted under 35 U.S.C. 154(b) by 346 days.

(21) Appl. No.: 17/353,362

(22) Filed: Jun. 21, 2021

(65) Prior Publication Data
US 2021/0398831 A1    Dec. 23, 2021

Related U.S. Application Data

(60) Provisional application No. 63/042,547, filed on Jun. 22, 2020.

(51) Int. Cl.
*H01L 21/67* (2006.01)
*H01L 21/677* (2006.01)

(52) U.S. Cl.
CPC .. *H01L 21/67276* (2013.01); *H01L 21/67736* (2013.01); *H01L 21/67766* (2013.01)

(58) Field of Classification Search
CPC ........ H01L 21/67276; H01L 21/67736; H01L 21/67766; H01L 21/67155; H01L 21/67703; G05B 2219/45031; G05B 19/042; G05B 19/418; G06Q 10/20; G10L 15/183; G10L 15/22; G10L 2015/225
See application file for complete search history.

(56) References Cited

U.S. PATENT DOCUMENTS

| | | | | |
|---|---|---|---|---|
| 10,656,720 | B1* | 5/2020 | Holz | G06F 3/011 |
| 2009/0228129 | A1* | 9/2009 | Moyne | G06Q 10/06 |
| | | | | 706/47 |
| 2014/0344627 | A1* | 11/2014 | Schaub | G06F 3/167 |
| | | | | 714/46 |

(Continued)

FOREIGN PATENT DOCUMENTS

| | | |
|---|---|---|
| EP | 3629543 A1 | 4/2020 |
| KR | 20200057297 A | 5/2020 |
| WO | WO 2019183719 A1 | 10/2019 |

OTHER PUBLICATIONS

Woo Hyung Chul, Converging system between smart semiconductor factory and cloud server (English translation of KR 2019-0073315), Jun. 26, 2019, ip.com machine translation (Year: 2019).*

(Continued)

*Primary Examiner* — Christopher W Carter
(74) *Attorney, Agent, or Firm* — Sheppard, Mullin, Richter & Hampton LLP

(57) ABSTRACT

In one embodiment, a system includes a wafer-handling system of a semiconductor-manufacturing system. The wafer-handling system is configured to hold one or more wafers for processing. The system also includes one or more processing components configured to physically treat the one or more wafers; a controller configured to operate the processing components; and a text bot in communication with the semiconductor-manufacturing system and configured to respond to a user inquiry.

20 Claims, 6 Drawing Sheets

(56) References Cited

U.S. PATENT DOCUMENTS

| | | | |
|---|---|---|---|
| 2017/0346768 A1* | 11/2017 | Wise | H04L 43/06 |
| 2018/0130260 A1* | 5/2018 | Schmirler | G06F 3/011 |
| 2018/0294174 A1 | 10/2018 | Fujikata | |
| 2019/0325660 A1* | 10/2019 | Schmirler | G06F 3/011 |
| 2020/0103858 A1* | 4/2020 | SayyarRodsari | H04L 63/0428 |
| 2021/0405544 A1* | 12/2021 | Werkman | G06N 3/04 |

OTHER PUBLICATIONS

International Search Report and Written Opinion for Application No. PCT/US2021/038437, dated Oct. 14, 2021, 11 pages.

* cited by examiner

AUTOMATED ASSISTANCE IN A SEMICONDUCTOR MANUFACTURING ENVIRONMENT

PRIORITY

This application claims the benefit under 35 U.S.C. § 119(e) of U.S. Provisional Patent Application No. 63/042,547, filed 22 Jun. 2020, which is incorporated herein by reference.

TECHNICAL FIELD

This disclosure generally relates to the manufacturing of semiconductor devices.

BACKGROUND

Semiconductor devices, such as integrated circuits (ICs), are typically manufactured with specialized semiconductor-manufacturing equipment, which may be referred to as tools or semiconductor tools. The process of manufacturing semiconductor devices usually involves various steps to physically treat a wafer. For example, material deposition can be accomplished by spin-on deposition, chemical vapor deposition (CVD), and sputter deposition among other means. Tools such as coater-developers and deposition chambers can be used for adding materials to a wafer. Material patterning can be accomplished via photolithography using scanner and stepper tools. Using photolithography, exposure to a pattern of actinic radiation causes a patterned solubility change in a film. Soluble material can then be dissolved and removed. Material etching can be performed using various etching tools. Etching tools can use plasma-based etching, vapor-based etching, or fluid-based etching. Chemical-mechanical polishing tools can mechanically remove materials and planarize a wafer. Furnaces and other heating equipment can be used to anneal, set, or grow materials. Metrology tools are used for measuring accuracy of fabrication at various stages.

Probers can test for functionality. Packaging tools can be used to put chips in a form to integrate with an intended device. Other tools include furnaces, CVD chambers, steppers, scanners, physical vapor deposition, atomic layer etcher, and ion implanters, to name a few. Typically, there are many tools involved in the fabrication of semiconductor devices.

SUMMARY OF PARTICULAR EMBODIMENTS

Continuous, accurate, and precise operation of a fleet of semiconductor tools can increase device yield. Such tools, however, tend to require periodic maintenance as well as unscheduled maintenance due to device failure or materials failure. Indeed, the semiconductor industry often experiences long delays, downtime, and yield loss that cost a significant amount in productivity and depreciation cost of process tools. Semiconductor-manufacturing tools tend to be complex and can be expensive to service and repair both in terms of cost and time. Many device makers have fabs distributed throughout the world. Accordingly, travel latency of expert technicians and engineers can add to the cost of repair and maintenance. Moreover, the maintenance resources and training time for process tools is growing.

Separate from maintenance and repair of tools, improving tool usage is also time consuming and costly. Identifying and improving recipes and tool usage parameters for better results is difficult and time consuming. Distributed semiconductor manufacturing environments can increase the challenge of applying best practices on all equipment.

Particular embodiments provide virtual attendants and virtual consultants (bots) assistance on semiconductor equipment. Particular embodiments include using software bots, artificial intelligence (AI), machine learning (ML), and natural-language processing (NLP) on semiconductor-manufacturing tools. In particular embodiments, bots, AI engines, ML programs, and language-processing (LP) engines are integrated with user-communication devices such as headsets and wearable visual displays to provide user assistance and automated optimization worldwide and on individual tools.

Particular embodiments enable rapid implementation of exact-copy models for usage and maintenance of process tools. Particular embodiments enable smart-automation tools to maintain consistency in manufacturing flows. In particular embodiments, remote, virtual, or augmented-reality access is provided. Virtual analytics and management may also be provided.

The embodiments disclosed herein are only examples, and the scope of this disclosure is not limited to them. Particular embodiments may include all, some, or none of the components, elements, features, functions, operations, or steps of the embodiments disclosed herein. The subject matter that can be claimed includes not only the particular combinations of features set out in the attached claims, but also includes other combinations of features. Moreover, any of the embodiments or features described or illustrated herein can be claimed in a separate claim or in any combination with any embodiment or feature described or illustrated herein or with any features of the attached claims. Furthermore, although this disclosure describes or illustrates particular embodiments as providing particular advantages, particular embodiments may provide none, some, or all of these advantages.

DESCRIPTION OF EXAMPLE EMBODIMENTS

Figure 1:
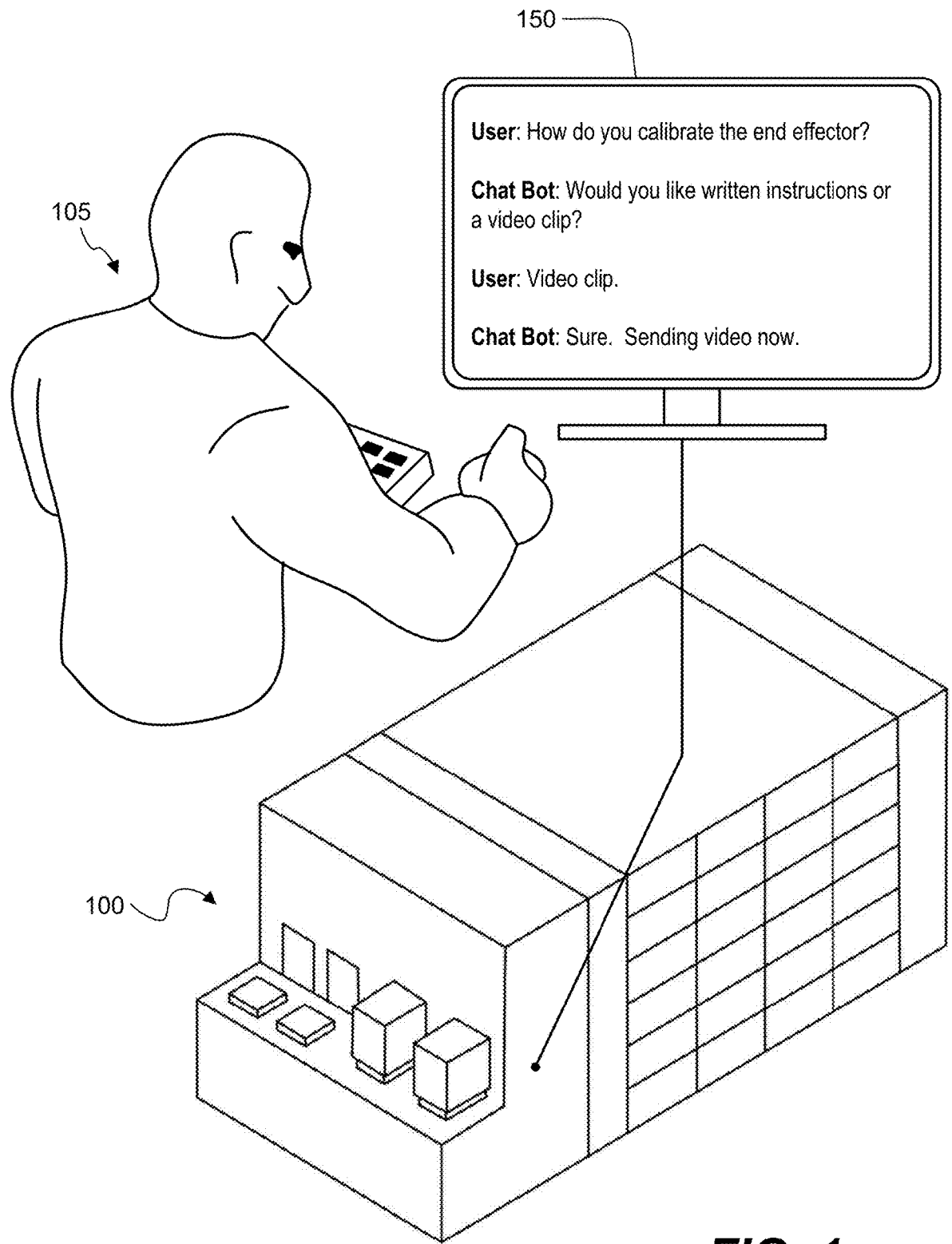
FIG. 1 illustrates an example semiconductor-manufacturing system.

Particular embodiments provide automated assistance on semiconductor equipment via virtual attendants and virtual consultants (such as bots or software bots). Particular embodiments include using software bots, AI, ML, and NLP on semiconductor manufacturing tools. In particular embodiments, bots, AI engines, ML programs, and LP engines are integrated with user-communication devices (such as headsets and wearable visual displays) to provide user assistance and automated optimization worldwide and on individual tools.

Particular embodiments include data-driven and model-driven AI and ML engines attached to, or in communication with, semiconductor tools. Advantages of particular embodiments include greater equipment uptime, lower mean time between failure (MTBF), lower mean time to repair (MTTR), or quicker ramp to yield. Particular embodiments can better predict system or tool creep or better predict process creep. Particular embodiments provide remote tool access as well as remote fab management for process engineers, facilities, maintenance, and field service.

Example embodiments include a semiconductor process tool (semiconductor-manufacturing system) having a text bot or text speech bot. The semiconductor-manufacturing system can include a wafer handling system configured to hold one or more wafers (substrates) for processing. Wafers can include conventional circular silicon wafers, but also includes other substrates. Other substrates can include flat panels such as for displays and solar panels. The wafer handling system can include, but is not limited to, wafer receiving ports, robotic wafer arms and transport systems, as well as substrate holders including edge holders, susceptors, electrostatic chucks, et cetera. In some embodiments, the wafer handling system can be as simple as a plate to hold a wafer while processing.

In particular embodiments, the semiconductor-manufacturing system includes processing components configured to physically treat one or more surfaces of the wafers. The particular processing components depend on a type of tool and treatment to be performed. Particular embodiments function on any number or type of process tool. For example, with an etcher tool, processing components can include a processing chamber with an opening to receive a wafer. The processing chamber can be adapted for vacuum pressures. A connected vacuum apparatus can create a desired pressure within the chamber. A gas-delivery system can deliver process gas or process gases to the chamber. An energizing mechanism can energize the gas to create plasma. A radio frequency source or other power delivery system can be configured to deliver a bias to the chamber to accelerate ions directionally. Likewise, for a coater-developer tool, such processing components can include a chuck to hold a wafer and rotate the wafer, a liquid dispense nozzle positioned to dispense liquid (such as a photoresist, developer, or other film-forming or cleaning fluid). As can be appreciated, the coater-developer tool can include any other conventional componentry.

In particular embodiments, the semiconductor-manufacturing system includes a controller configured to operate the processing components. The controller can be positioned on the tool or can be located remotely and connect to the tool. The semiconductor-manufacturing system includes a text bot in communication with the semiconductor-manufacturing system. The text bot can have various alternative architectures. For example, the text bot (or other engine herein such as a natural-language processor or conversational bot) can have a corresponding processor and memory positioned at the tool (within the tool, mounted on the tool, or otherwise attached to the tool). Alternatively, the bot execution hardware can be located remotely, such as in a server bank adjacent to a tool (or fab), or the bot can be executed while geographically distant (e.g. in a separate country). Configurations can have redundant, multiple or complementary bots. For example, particular embodiments can include an on-tool bot as well as a remote both with either bot able to respond to inquiries and execute actions. Alternatively, an on-tool bot can address one group or type of inquiry (such as diagnostic information), while a remote server-based bot can access deep learning and network data, as well as data from other tools within an integration flow to predict failures and suggest actions for optimization.

In particular embodiments, the text bot is configured to return or respond to inquiries from users (at-tool users or remote users). The text bot can also execute actions on the tool such as wafer processing or tool maintenance. By way of a non-limiting example, the text bot can be used for fault detection and classification (FDC). For example, a user working on a given process tool encounters a tool failure or fault condition. Instead of relying on operator training or expert technician availability, the user can enter a text query such as to solve a failure condition. The text bot can respond with solutions, additional questions, information, et cetera. The solutions and additional help can be in the form of text, audio, video, augmented reality (AR) and automated actions. For example, a given process tool has a failure. By way of text inquiry, a user asks for solutions to address the tool failure. Input can be an error code entered by the user, or the text bot can electronically access error codes and diagnostic data. The text bot can return answers in text, such as steps to take to fix the tool, or display documents and images to assist or explain a particular repair procedure. Alternatively, the text bot can access video showing steps to fix the tool. If, for example, a focus ring is identified as part of a tool failure, the text bot or semiconductor-manufacturing system can return a video showing the best known way to replace the focus ring. If, instead of tool failure, the issue relates to poor processing, such as non-uniform etching, the then an inquiry about how to improve etch uniformity for a given gas, temperature, or film to etch can be entered via the text bot, and then the text bot can return a best known recipe for a given etch. This best known recipe can be obtained from data used at any other tool in network or from an extended network, such as from outside a corresponding organization.

In particular embodiments, the semiconductor-manufacturing system includes a text bot, speech bot, or conversational bot. Such a semiconductor-manufacturing system can include a speech bot in communication with the semiconductor-manufacturing system and be configured to respond to user spoken inquiries. The speech bot (or other bot) can be configured to access and operate system components including advance process control (APC) as well as basic process control. In particular embodiments, bots can be used to identify causes of yield loss as well as improving yield. Bots and responses can be metric driven. For example, responses can provide input that increases MTBF, increases uptime, reduces MTTR, reduces queue time variance, and can consider entitlement metrics. The speech bot is used for contextual searching of the most logical and relevant information that the user is asking for. The AI/ML engine in the NLP Bot can real time learn from user experience. Another way this Bot is trained is to provide assistance for trouble shooting. In this case the Bot ingests various logs and past actions along with trouble shooting decision making logic tree, to assist the user to access the correct information for the problem solving or lead to remote escalation to a subject matter expert.

In particular embodiments, bots can be implemented with AI engines. Users can connect to AI conversational bots using headsets and heads-up displays. This provides an assistant-immersed experience. AI translations can assist with distributing Copy Exact periodic maintenance and with Best Known Methods (BKMs) for operation and maintenance. Headlock remote pointing can assist with Copy Exact error recovery. In particular embodiments, semiconductor-manufacturing systems have AR user hardware. Both tool use and tool maintenance/repair can be captured and delivered to users via video in AR or virtual-reality (VR) systems.

Particular embodiments can include unstructured AR video acquisition learning. Embodiments can include digital transformation automation augmentation.

In particular embodiments, video-recording systems record maintenance actions and operation actions of users on-tool anywhere in the world. Deep learning and AI analysis can correlate particular actions (as well as corresponding video) to a best known method for highest yield, longest time between failure, and so forth. After a particular solution and corresponding video is identified, any time another user encounters an identical or similar problem, the on-tool virtual assistant can access the identified best solution, and even display solutions with corresponding video. Such video, thereby provides expert solutions without travel and expense associated with expert engineers and technicians.

Virtual assistants or consultants in particular embodiments can access general knowledge about semiconductor tools, as well as tool-specific characterization. Data can also account for design technology optimization and integration flows. For example, a given patterning process typically uses multiple process tools. A spin-coater for film formation, a stepper for pattern exposure, a developer for etch mask formation, an etcher for pattern transfer, vapor depositor for conformal film formation, and so on. All of these tools may be used in a pattern multiplication flow. A conversational bot can be queried to find the best tools and operating parameters to maximize yield on a given pitch quad flow, for example.

Particular embodiments include deep learning across many tools, many organizations, manuals, user input. This learning can feed into a user interface platform through preparing and structuring fab data for both model driven and data driven analytics. Systems include data collection interfaces scalable across tools and fabs. User interface platforms make use of conversational bots, AI, NLP, audio/video, and AR systems. An advantage of particular embodiments is that user manuals for tools—and answers therein—are readily accessible by a bot assistant. This means a given user manual of a tool does not need to be studied prior to working on a tool.

One embodiment includes use of on-tool AI for semiconductor equipment. One or more AI engines are incorporated in a semiconductor-manufacturing system. Alternatively the AI engine is in network communication with the semiconductor-manufacturing system. Such an AI engine can assist users (local and remote) with many operations such as to correct failures, optimize operation, and repair failures.

Another example embodiment includes NLP bots on a semiconductor-manufacturing system. An NLP bot can be used for various tasks and operations, such as to increase tool uptime. An NLP bot includes a virtual assistant or virtual consultant interface that responds to natural language input from a user. NLP bots can parse a natural language query, and fetch corresponding data or results. NLP bots can receive spoken input or keyed-in queries. A speech-to-text engine can assist with converting spoken queries to text. Having an NLP bot on a semiconductor-manufacturing system enables voice-based trouble shooting, optimization as well as voice control of the tool. Another example embodiment uses an NLP bot or LP bot on a semiconductor-manufacturing system to improve MTTR and MTBF.

Another example embodiment includes a head gear system in communication with an AI engine or conversational bot on a semiconductor-manufacturing system. The head gear system includes wearable inputs and outputs to interface with a given tool. Such a head gear system can include a speaker, a microphone, and can also include a visual display. The head gear system can receive natural language input. The headgear system or a processor in communication with the head gear unit can translate spoken language into text to interact with a text bot or conversational bot on a semiconductor-manufacturing system.

Particular embodiments include ingestion of text manuals via an NLP engine and AI training decision matrix that produces a conversational AI interface on a piece of semiconductor equipment. Thus, in particular embodiments, responses from a virtual consultant leverage knowledge from product manuals and many other sources such as presentations, knowledge documents, videos, and other data. The AI engine can also ingest data from dynamic sources including tool diagnostics, alarms, pass down logs, metrology data and images, manufacturing operations management software, user notes, and user interface console access.

For data ingestion, one or more data servers can be configured to receive various raw data. Data can be consumed from any tool-related resource. For example, data can be extracted from servers from equipment makers as well as chip makers. Data is extracted, transformed and loaded from structured and unstructured sources. A data pre-processing step can be executed. This can include key pair indexing, sentence splitting, tokenization, part-of-speech tagging, parentheses correction, et cetera. Data pre-processing can also include diagnostic data learning. This can include data structuring, creating a model with an application program interface for queries to trigger alarms based on parameters or pull graphs on demand. Data analytics can be used to address creep, drift, or abnormal alarms with push notification.

After data pre-processing, model selection can be executed. This can include topic modeling, machine translation, dialog systems analysis, query ranking, and question answers. Model selection and creation can be fed into a knowledge graph or matrix. Optional enhancements can include forming interactive management information systems and executive information systems. This provides a collaborative knowledge base, a recommendation system for task/work, and cycle time insights, to name a few.

In particular embodiments, a conversational AI engine can access any or all of these models and systems in responding to user queries, commands, and actions. In some embodiments, the AI engine can monitor tool usage, recipe selection, operating parameters, and other actions, and then suggest to a user optimized recipes, warn or predict potential failures, recommend repairs to increase uptime, and other actions and suggestions to generally increase uptime and yield. Various interfaces can be used. Interfaces can include advanced NLP and AI bot functionality, AR user interface, computer vision productivity, remote tool access IT infrastructure, fab analytics, and digital twin and virtual fab operation.

Particular embodiments include an on-tool conversational AI system with multiple hierarchical conversations configured to exhibit questions and answers with more than one question and more than one answer. In particular embodiments, the AI engine can link metrology data from other areas of a semiconductor fabrication environment to benefit the performance and operational quality of semiconductor equipment. In particular embodiments, a semiconductor-fabrication environment can include, for example, a room or other space with a few tools, a large-scale fab, or tools located in different buildings and geographical areas. Particular embodiments can leverage data from accessible tools and data all over the world. In particular embodiments, the AI engine can analyze metrology data from tools being used at any location in the world, identify best performing tool(s), and recommend operating parameters for tools not among the best performing tool(s).

Particular embodiments include using the AI engine interfacing with AR devices usable or wearable by users. For example, with AR equipment, a user (such as a field service engineer) can observe a part of a semiconductor-manufacturing system to repair or service, and information is directly overlaid on that particular semiconductor-manufacturing system. This can reduce training time of tool technicians. Instead of having extensive classes to cover all service procedures, detailed instructions can be delivered to a technician at a tool on demand. Images and video can be overlaid on device parts. Audio instructions can accompany video. The connected conversational bot can respond to natural language requests such as "How do I access the resist pump on this track tool?" The AR system can guide a user to an access panel, indicate fasteners to remove, display a location of the pump, and instruct on how to repair/replace. Any suitable questions can be answered with tutorials, and any type of image format can be overlaid on tools such as an arrow or a visually highlighted part.

In particular embodiments, the AR system can be useful not only for tool repair, but also for tool usage. In particular embodiments, AR systems can instruct users on loading wafers, creating recipes, accessing and explaining control panels. The AR and AI systems in particular embodiments can systematically provide a best known method so that an exact same method can be used in multiple applications in the semiconductor industry. For example, a user needs to etch a silicon-germanium layer selective to other materials. This layer might have eighty percent silicon and 20% germanium. The user asks a conversational bot or AR system for the best known method for etching SiGe 80/20, and the conversational bot returns one or more answers. Answers can include BKM for etching on a tool of interest, and can also indicate a different tool that will etch the desired material with higher accuracy.

In addition to AR, particular embodiments leverage VR. In particular embodiments, the AI engine and associated data processing can execute deep learning from the semiconductor environment to create procedures that can become Copy Exact procedures by means of having the same information available to the same users. AR and VR systems can be used both for tool usage and for tool training. Instead of users traveling distances for learning how to operate and service a given tool, instruction can be delivered by virtual reality. A user can see, via a head set, how to service a furnace tool or begin a plasma-based etch recipe. After virtual training, while at the tool, AR can then be used to assist with tool usage to make sure Copy Exact is implemented.

Headsets and other video recording equipment can be used to record and create video clips, which may then be identified as BKMs for Copy Exact status. Identification of BKMs can be executed by manual classification or by analysis from the AI engine. For example, a seasoned field service technician can perform as less-common tool repair and record the process from a head set. The user then tells the conversational AI bot that the process just performed is the best way to fix that particular issue. The associated NLP bot can parse that comment, identify the video clip and store that video clip in a data matrix for access by a subsequent user. The subsequent user can ask the conversational bot/AI engine if there are any solutions to that particular problem. The conversational bot can then respond with the answer, display a relevant video clip and even provide AR assistance.

In some embodiments, headgear or a wearable user device provides access to an AI text interface through voice command and is controllably connected to semiconductor-manufacturing system(s). Information gathered from a query to the AI engine can be used to form a graphical representation of data for a user of a particular semiconductor-manufacturing system.

Deep learning via an AI engine or other analysis tools can be used on a semiconductor-manufacturing system to enhance function of onboard operational capabilities of the semiconductor-manufacturing system. Response and actions of the AI engine can be in response to user queries or background monitoring of tool usage. The AI engine can include a web interface configured to compare and contrast data sets from different pieces of semiconductor equipment. The AI engine on a tool can provide a comparison between best known methods and apply deep learning to establish which method, of a set of possible methods, performs better. This comparison can be based on AI analysis.

Particular embodiments can include an AI engine and deep learning system that identifies and stores best methods for a particular procedure, as well as updating and tracking that procedure. This BKM monitoring can be verified against a set of data that determines the efficacy of a given BKM or candidate methods for replacement of BKMs.

Particular embodiments can use onboard or on-tool AI in a closed system without connection to the Internet. Such a closed system AI can be configured to understand local minima and optimization of a local data environment to improve a value and function of the semiconductor equipment. Example optimization parameters include uptime, MTBF, MTTR, and overall equipment effectiveness (OEE), as well as other parameters that enhance performance metrics from AI answers and actions.

In particular embodiments, the semiconductor-manufacturing-system AI engine can be connected to basic tool control systems as well as advance process control (APC) technologies that produce an update of a constant feedback condition or feed forward condition. In particular embodiments, the semiconductor-manufacturing-system AI engine can be configured to diagnose and produce an analysis of onboard error codes, and deliver to a user (or user interface) a procedure to recover from that error code.

Particular embodiments include a semiconductor-manufacturing system having a text bot with an NLP engine. The NLP engine can then parse written or spoken user queries, access stored data (on-tool or network-based) and provide textual responses.

In particular embodiments, the AI and deep-learning engine can be used to image a given performance and record experience that has previously been conducted on a specific semiconductor tool or associated tool by an expert user for recall at a later time. Headgear can be used to record such procedural video clips that can be retrieved by an onboard (or networked) AI on a particular semiconductor-manufacturing system.

Particular embodiments include two pieces of headgear. One headgear unit can be used in the environment of virtual reality, while another headgear unit can be used in the environment of AR to promote remote accessibility of a semiconductor-manufacturing system. A given headgear unit of VR or AR can be linked to another piece of headgear that is AR or VR. Accordingly, remote VR or AR users can be linked to local AR or VR users for assistance or training or collaboration. Particular embodiments can include use of head gear or other user interfaces to access an AR system used by another professional who is interacting with the AI engine or system on a particular piece of semiconductor equipment. The remote user can be observing the local user so as to learn or evaluate. In addition or as an alternative, the remote user can be directing the local user via the AR equipment and AI engine. In particular embodiments, remote and local AR/VR users can connect to each other and a given tool from within a same building or campus via local area network, or they can connect across significant or international distances via the Internet. Accordingly, transportation of the expert to a site of a tool of interest may be unnecessary. Instead from a remote or local location, novice and expert users can interact with each other and interact with one or more bots on the tool of interest. Depending on the tool or semiconductor environment, the tool can have a text bot, NLP-to-text bot, virtual attendant, and AI engine for various levels of automated assistance.

In particular embodiments, the AI engine on a semiconductor-manufacturing system is configured to learn through structured learning how to best optimize input and output data and operational efficacy of that particular semiconductor-manufacturing system. The AI engine on a tool (or in network communication with the tool) is configured to link relevant yield data available elsewhere in a semiconductor fabrication facility (or facilities) to optimize a function of that tool. In particular embodiments, on-tool automated assistants (text bots, NLP bots, language bots, AI engines) can function as a first point of information and resource before escalating to field service engineering.

FIG. 1 illustrates an example semiconductor-manufacturing system 100. This tool (100) can be any apparatus configured to process/treat semiconductor wafers or other micro-fabricated substrates. For example, semiconductor-manufacturing system 100 can be a coater-developer, scanner, etcher, furnace, plating tool, metrology tool, et cetera. User 105 can be any operator such as a process engineer, technician, field service engineer, among others. Semiconductor-manufacturing system 100 includes on-board virtual consultant 150. Virtual consultant 150 can be embodied as any of, or any combination of, text chat bot, speech-to-text chat bot, virtual assistant, or AI engine, with LP or NLP. With such a system, a given user can directly query the virtual consultant to a receive answers to any questions such as how to perform a given wafer treatment process, what errors were recorded in a given time frame, how a particular component is repaired or replaced, and so forth.

Figure 2:
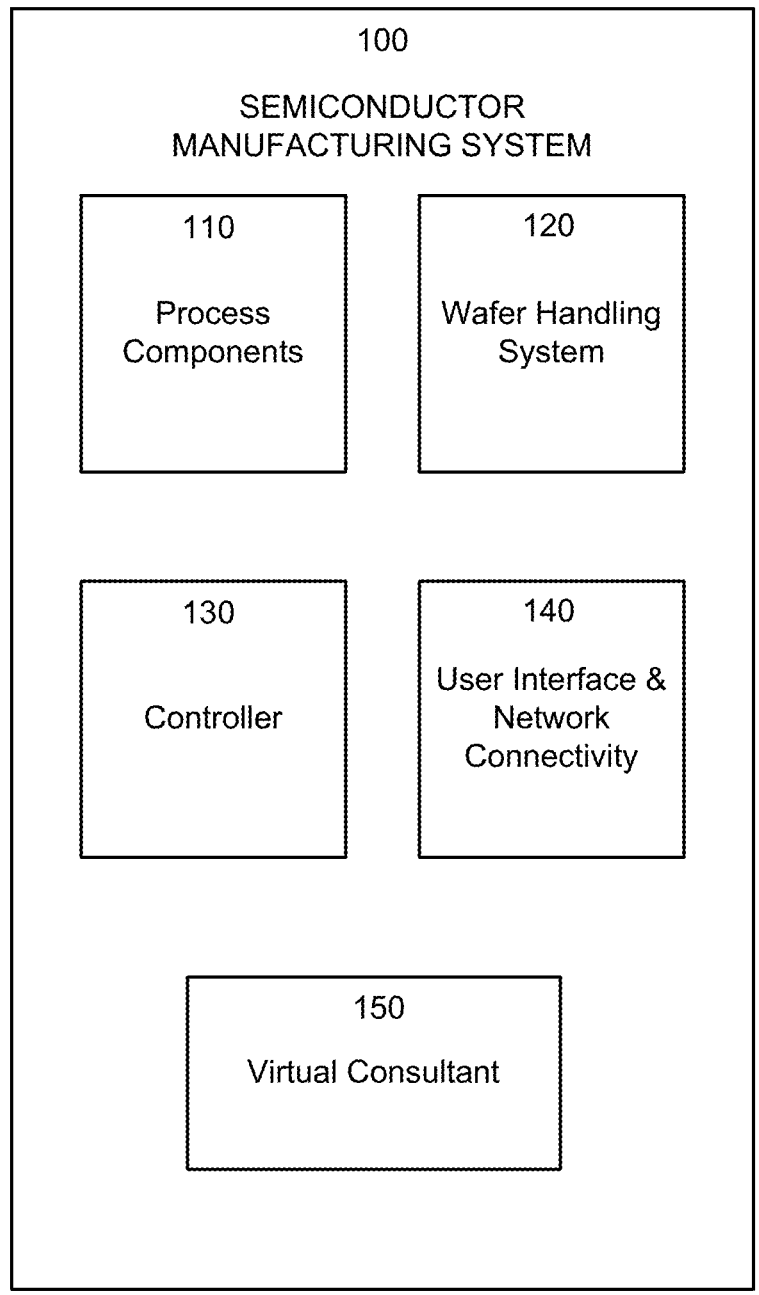
FIG. 2 further illustrates the example semiconductor-manufacturing system of FIG. 1.

FIG. 2 further illustrates example semiconductor-manufacturing system. Although a particular semiconductor-manufacturing system is described and illustrated, this disclosure contemplates any suitable semiconductor-manufacturing system. In the example of FIG. 2, semiconductor-manufacturing system 100 includes process components 110, which by way of example may include vacuum chambers, susceptors, induction coils, dispense nozzles, optics, and other conventional features. Wafer handling system 120 can include handlers and associated robotics to receive wafers from a user or wafer cartridge, transport to processing modules, and return to an input/output port or other module within the tool. Controller 130 can include all of the tool processor, memory, and associated electronics to control the tool including control of robotics, valves, spin cups, exposure columns, and any other tool component. User Interface 140 can include any display screen, physical controls, remote network interfaces, local interfaces, and so forth. Virtual consultant 150 can be installed on or within the semiconductor-manufacturing system for immediate use without any network connection. In addition or as an alternative, virtual consultant 150 can be installed in an adjacent server or network. Virtual consultant 150 can be installed at a remote location and can connect or otherwise support any number of different tools.

Figure 3:
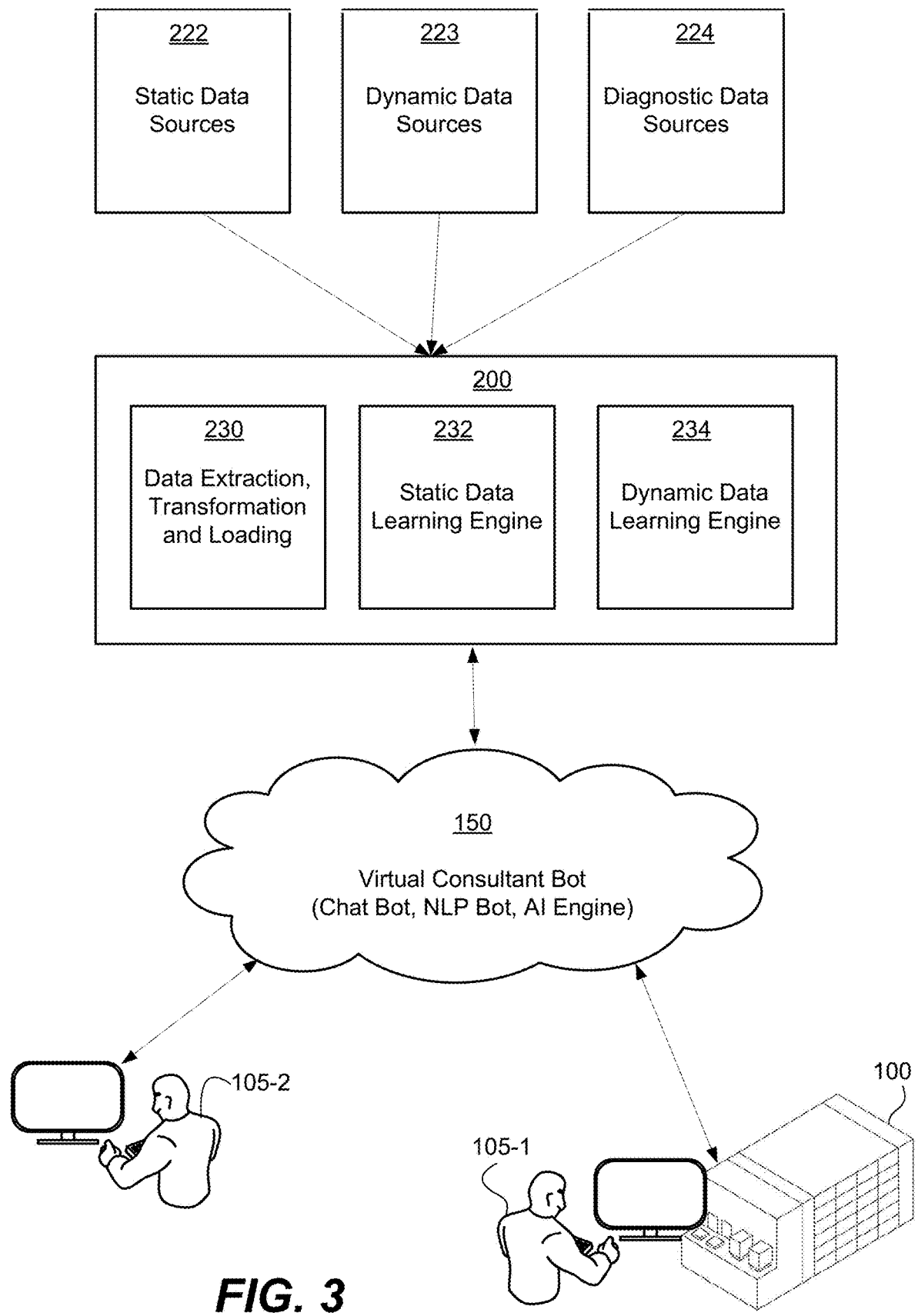
FIG. 3 illustrates an example architecture for data ingestion, retrieval, and deep learning.

FIG. 3 illustrates an example architecture for data ingestion, retrieval, and deep learning. Data sources 222, 223, and 224 can be accessed to extract data. This data can be formatted or raw. Data processor 200 can include an ETL module 230, engines for learning from static and dynamic data (232, 234), as well as any other data learning and formatting engines such as NLP engines. Processed data can be made available to, or pushed to virtual consultant 150. Virtual consultant 150 can be located on a given network or located within a semiconductor-manufacturing system 100. Local user 105-1 can directly access, for example, a conversational bot at the semiconductor-manufacturing system 100. Remote user 105-2 can also access semiconductor-manufacturing system 100 via a network connection.

Figure 4:
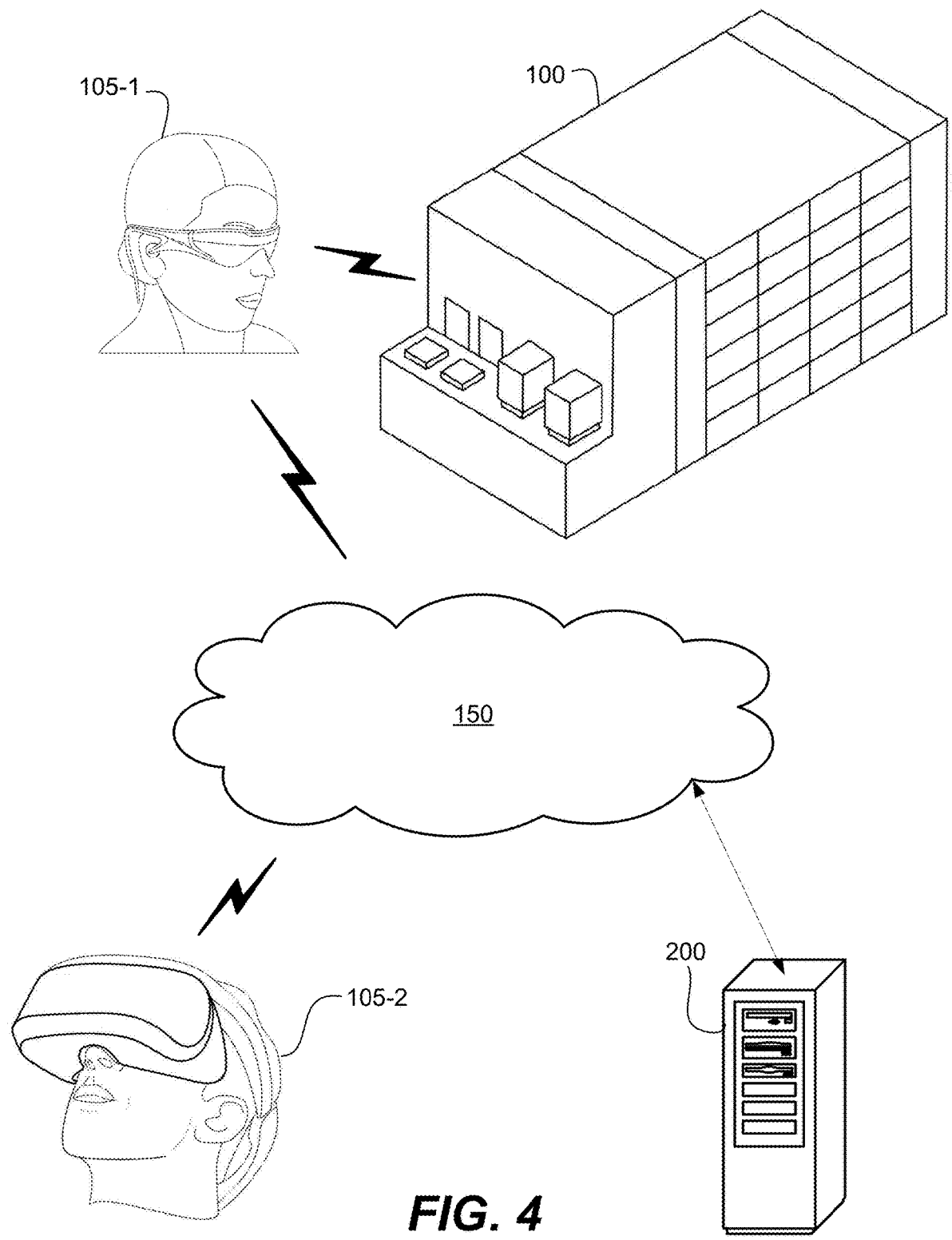
FIG. 4 illustrates example interaction between a user and an example virtual assistant.

FIG. 4 illustrates example interaction between a user and an example virtual assistant. In the example of FIG. 4, local user 105-1 can physically access semiconductor-manufacturing system 100. This can be accomplished via any user input. In this example, local user 105-1 is equipped with an AR head set. This can include visual overlay of parts and components when viewing the tool or control panel. Through the AR headset, local user 105-1 can communicate with virtual consultant 150 such as by natural language speech. Virtual consultant 150 can return answers via audio, text, video, or other media. Virtual consultant 150 can be on-tool or network located and can access data processor 200 to retrieve stored and real-time data. Remote user 105-2 can be in communication with both virtual consultant 150 and local user 105-1. With a VR headset, remote user 105 can view video and audio from local user 105-1, send instructions to local user 105-1. Both users can be collaborative, or expert and novice. For example, the expert user can be remotely located and assist the local user located at a location that can be in a different country or area. Alternatively, the local user can be the expert training various remote users on tool operation and maintenance. Although particular interaction between a user and a particular virtual assistant are described and illustrated, this disclosure contemplates any suitable interaction between a user and any suitable virtual assistant.

Figure 5:
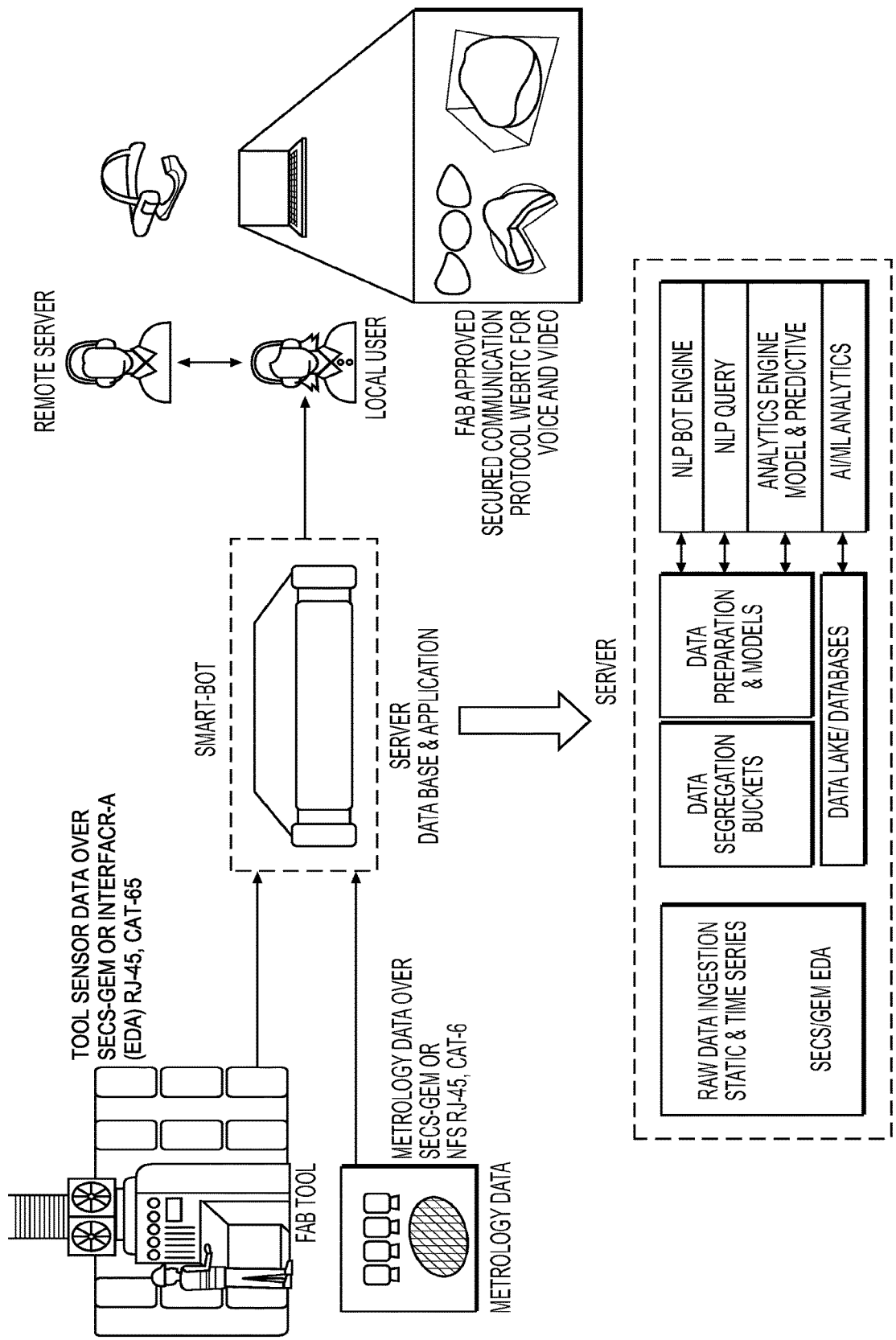
FIG. 5 illustrates an example smart-bot solution.

FIG. 5 illustrates an example smart-bot solution. In the example of FIG. 5, an AI/ML driven solution for fab tools is provided to improve process-engineering efficiency, wafer uniformity across tools and fleet, and equipment uptime. As can be appreciated, any suitable number of users and conversational bot configurations are contemplated to provide automated assistance for semiconductor-manufacturing systems. In particular embodiments, assistance can be provided without training or travel.

Figure 6:
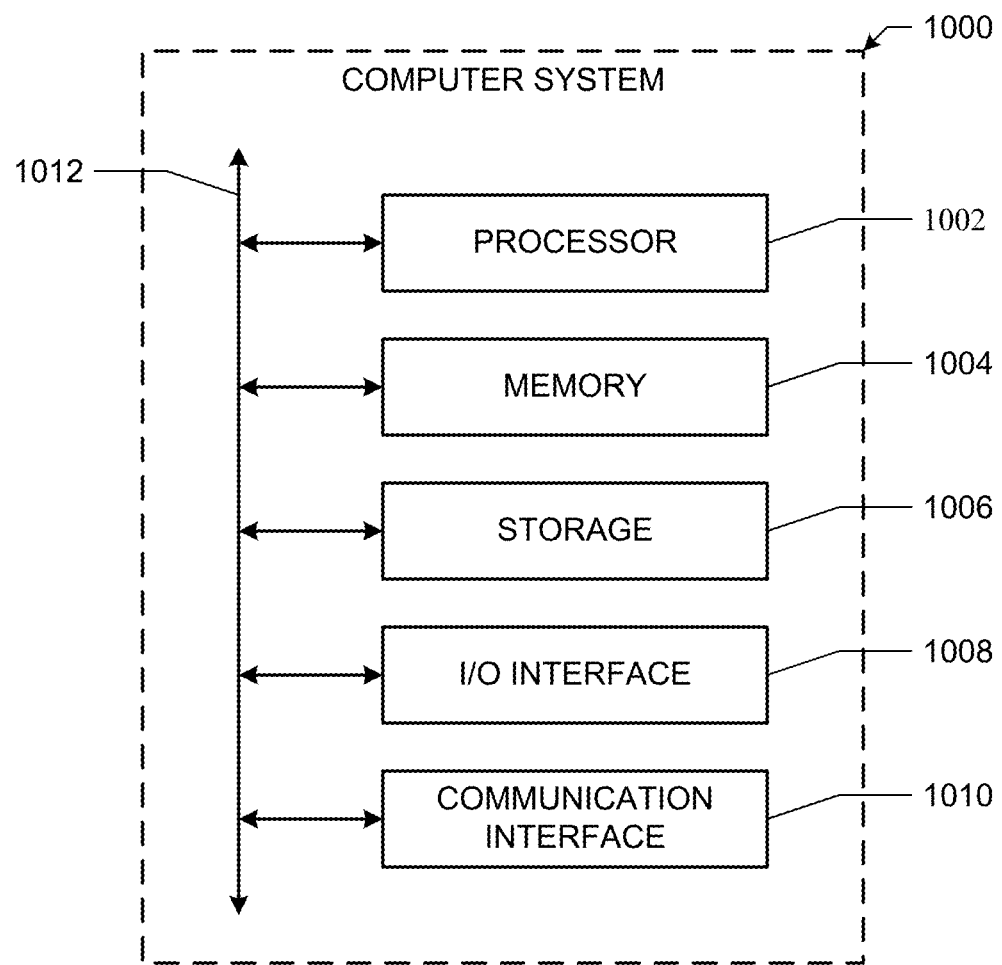
FIG. 6 illustrates an example computer system.

FIG. 6 illustrates an example computer system 1000. In particular embodiments, one or more computer systems 1000 perform one or more steps of one or more methods described or illustrated herein. In particular embodiments, one or more computer systems 1000 provide functionality described or illustrated herein. In particular embodiments, software running on one or more computer systems 1000 performs one or more steps of one or more methods described or illustrated herein or provides functionality described or illustrated herein. Particular embodiments include one or more portions of one or more computer systems 1000. Herein, reference to a computer system may encompass a computing device, and vice versa, where appropriate. Moreover, reference to a computer system may encompass one or more computer systems, where appropriate.

This disclosure contemplates any suitable number of computer systems 1000. This disclosure contemplates computer system 1000 taking any suitable physical form. As example and not by way of limitation, computer system 1000 may be an embedded computer system, a system-on-chip (SOC), a single-board computer system (SBC) (such as, for example, a computer-on-module (COM) or system-on-module (SOM)), a desktop computer system, a laptop or notebook computer system, an interactive kiosk, a mainframe, a mesh of computer systems, a mobile telephone, a personal digital assistant (PDA), a server, a tablet computer system, an AR/VR device, or a combination of two or more of these. Where appropriate, computer system 1000 may include one or more computer systems 1000; be unitary or distributed; span multiple locations; span multiple machines; span multiple data centers; or reside in a cloud, which may include one or more cloud components in one or more networks. Where appropriate, one or more computer systems 1000 may perform without substantial spatial or temporal limitation one or more steps of one or more methods described or illustrated herein. As an example and not by way of limitation, one or more computer systems 1000 may perform in real time or in batch mode one or more steps of one or more methods described or illustrated herein. One or more computer systems 1000 may perform at different times or at different locations one or more steps of one or more methods described or illustrated herein, where appropriate.

In particular embodiments, computer system 1000 includes a processor 1002, memory 1004, storage 1006, an input/output (I/O) interface 1008, a communication interface 1010, and a bus 1012. Although this disclosure describes and illustrates a particular computer system having a particular number of particular components in a particular arrangement, this disclosure contemplates any suitable computer system having any suitable number of any suitable components in any suitable arrangement.

In particular embodiments, processor 1002 includes hardware for executing instructions, such as those making up a computer program. As an example and not by way of limitation, to execute instructions, processor 1002 may retrieve (or fetch) the instructions from an internal register, an internal cache, memory 1004, or storage 1006; decode and execute them; and then write one or more results to an internal register, an internal cache, memory 1004, or storage 1006. In particular embodiments, processor 1002 may include one or more internal caches for data, instructions, or addresses. This disclosure contemplates processor 1002 including any suitable number of any suitable internal caches, where appropriate. As an example and not by way of limitation, processor 1002 may include one or more instruction caches, one or more data caches, and one or more translation lookaside buffers (TLBs). Instructions in the instruction caches may be copies of instructions in memory 1004 or storage 1006, and the instruction caches may speed up retrieval of those instructions by processor 1002. Data in the data caches may be copies of data in memory 1004 or storage 1006 for instructions executing at processor 1002 to operate on; the results of previous instructions executed at processor 1002 for access by subsequent instructions executing at processor 1002 or for writing to memory 1004 or storage 1006; or other suitable data. The data caches may speed up read or write operations by processor 1002. The TLBs may speed up virtual-address translation for processor 1002. In particular embodiments, processor 1002 may include one or more internal registers for data, instructions, or addresses. This disclosure contemplates processor 1002 including any suitable number of any suitable internal registers, where appropriate. Where appropriate, processor 1002 may include one or more arithmetic logic units (ALUs); be a multi-core processor; or include one or more processors 1002. Although this disclosure describes and illustrates a particular processor, this disclosure contemplates any suitable processor.

In particular embodiments, memory 1004 includes main memory for storing instructions for processor 1002 to execute or data for processor 1002 to operate on. As an example and not by way of limitation, computer system 1000 may load instructions from storage 1006 or another source (such as, for example, another computer system 1000) to memory 1004. Processor 1002 may then load the instructions from memory 1004 to an internal register or internal cache. To execute the instructions, processor 1002 may retrieve the instructions from the internal register or internal cache and decode them. During or after execution of the instructions, processor 1002 may write one or more results (which may be intermediate or final results) to the internal register or internal cache. Processor 1002 may then write one or more of those results to memory 1004. In particular embodiments, processor 1002 executes only instructions in one or more internal registers or internal caches or in memory 1004 (as opposed to storage 1006 or elsewhere) and operates only on data in one or more internal registers or internal caches or in memory 1004 (as opposed to storage 1006 or elsewhere). One or more memory buses (which may each include an address bus and a data bus) may couple processor 1002 to memory 1004. Bus 1012 may include one or more memory buses, as described below. In particular embodiments, one or more memory management units (MMUs) reside between processor 1002 and memory 1004 and facilitate accesses to memory 1004 requested by processor 1002. In particular embodiments, memory 1004 includes random access memory (RAM). This RAM may be volatile memory, where appropriate. Where appropriate, this RAM may be dynamic RAM (DRAM) or static RAM (SRAM). Moreover, where appropriate, this RAM may be single-ported or multi-ported RAM. This disclosure contemplates any suitable RAM. Memory 1004 may include one or more memories 1004, where appropriate. Although this disclosure describes and illustrates particular memory, this disclosure contemplates any suitable memory.

In particular embodiments, storage 1006 includes mass storage for data or instructions. As an example and not by way of limitation, storage 1006 may include a hard disk drive (HDD), a floppy disk drive, flash memory, an optical disc, a magneto-optical disc, magnetic tape, or a Universal Serial Bus (USB) drive or a combination of two or more of these. Storage 1006 may include removable or non-removable (or fixed) media, where appropriate. Storage 1006 may be internal or external to computer system 1000, where appropriate. In particular embodiments, storage 1006 is non-volatile, solid-state memory. In particular embodiments, storage 1006 includes read-only memory (ROM). Where appropriate, this ROM may be mask-programmed ROM, programmable ROM (PROM), erasable PROM (EPROM), electrically erasable PROM (EEPROM), electrically alterable ROM (EAROM), or flash memory or a combination of two or more of these. This disclosure contemplates mass storage 1006 taking any suitable physical form. Storage 1006 may include one or more storage control units facilitating communication between processor 1002 and storage 1006, where appropriate. Where appropriate, storage 1006 may include one or more storages 1006. Although this disclosure describes and illustrates particular storage, this disclosure contemplates any suitable storage.

In particular embodiments, I/O interface 1008 includes hardware, software, or both, providing one or more interfaces for communication between computer system 1000 and one or more I/O devices. Computer system 1000 may include one or more of these I/O devices, where appropriate. One or more of these I/O devices may enable communication between a person and computer system 1000. As an example and not by way of limitation, an I/O device may include a keyboard, keypad, microphone, monitor, mouse, printer, scanner, speaker, still camera, stylus, tablet, touch screen, trackball, video camera, another suitable I/O device or a combination of two or more of these. An I/O device may include one or more sensors. This disclosure contemplates any suitable I/O devices and any suitable I/O interfaces 1008 for them. Where appropriate, I/O interface 1008 may include one or more device or software drivers enabling processor 1002 to drive one or more of these I/O devices. I/O interface 1008 may include one or more I/O interfaces 1008, where appropriate. Although this disclosure describes and illustrates a particular I/O interface, this disclosure contemplates any suitable I/O interface.

In particular embodiments, communication interface 1010 includes hardware, software, or both providing one or more interfaces for communication (such as, for example, packet-based communication) between computer system 1000 and one or more other computer systems 1000 or one or more networks. As an example and not by way of limitation, communication interface 1010 may include a network interface controller (NIC) or network adapter for communicating with an Ethernet or other wire-based network or a wireless NIC (WNIC) or wireless adapter for communicating with a wireless network, such as a WI-FI network. This disclosure contemplates any suitable network and any suitable communication interface 1010 for it. As an example and not by way of limitation, computer system 1000 may communicate with an ad hoc network, a personal area network (PAN), a local area network (LAN), a wide area network (WAN), a metropolitan area network (MAN), or one or more portions of the Internet or a combination of two or more of these. One or more portions of one or more of these networks may be wired or wireless. As an example, computer system 1000 may communicate with a wireless PAN (WPAN) (such as, for example, a BLUETOOTH WPAN), a WI-FIFI network, a WI-MAX network, a cellular telephone network (such as, for example, a Global System for Mobile Communications (GSM) network), or other suitable wireless network or a combination of two or more of these. Computer system 1000 may include any suitable communication interface 1010 for any of these networks, where appropriate. Communication interface 1010 may include one or more communication interfaces 1010, where appropriate. Although this disclosure describes and illustrates a particular communication interface, this disclosure contemplates any suitable communication interface.

In particular embodiments, bus 1012 includes hardware, software, or both coupling components of computer system 1000 to each other. As an example and not by way of limitation, bus 1012 may include an Accelerated Graphics Port (AGP) or other graphics bus, an Enhanced Industry Standard Architecture (EISA) bus, a front-side bus (FSB), a HYPERTRANSPORT (HT) interconnect, an Industry Standard Architecture (ISA) bus, an INFINIBAND interconnect, a low-pin-count (LPC) bus, a memory bus, a Micro Channel Architecture (MCA) bus, a Peripheral Component Interconnect (PCI) bus, a PCI-Express (PCIe) bus, a serial advanced technology attachment (SATA) bus, a Video Electronics Standards Association local (VLB) bus, or another suitable bus or a combination of two or more of these. Bus 1012 may include one or more buses 1012, where appropriate. Although this disclosure describes and illustrates a particular bus, this disclosure contemplates any suitable bus or interconnect.

Herein, a computer-readable non-transitory storage medium or media may include one or more semiconductor-based or other integrated circuits (ICs) (such, as for example, field-programmable gate arrays (FPGAs) or application-specific ICs (ASICs)), hard disk drives (HDDs), hybrid hard drives (HHDs), optical discs, optical disc drives (ODDs), magneto-optical discs, magneto-optical drives, floppy diskettes, floppy disk drives (FDDs), magnetic tapes, solid-state drives (SSDs), RAM-drives, SECURE DIGITAL cards or drives, any other suitable computer-readable non-transitory storage media, or any suitable combination of two or more of these, where appropriate. A computer-readable non-transitory storage medium may be volatile, non-volatile, or a combination of volatile and non-volatile, where appropriate.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated otherwise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, the embodiments disclosed herein are only examples, and the scope of this disclosure is not limited to them. Particular embodiments may include all, some, or none of the components, elements, features, functions, operations, or steps of the embodiments disclosed herein. Furthermore, although this disclosure describes and illustrates respective embodiments herein as including particular components, elements, feature, functions, operations, or steps, any of these embodiments may include any combination or permutation of any of the components, elements, features, functions, operations, or steps described or illustrated anywhere herein that a person having ordinary skill in the art would comprehend. The subject matter that can be claimed includes not only the particular combinations of features set out in the attached claims, but also includes other combinations of features. Moreover, any of the embodiments or features described or illustrated herein can be claimed in a separate claim or in any combination with any embodiment or feature described or illustrated herein or with any features of the attached claims. Furthermore, although this disclosure describes or illustrates particular embodiments as providing particular advantages, particular embodiments may provide none, some, or all of these advantages.

Embodiments according to the invention are in particular disclosed in the attached claims directed to a method, a storage medium, a system and a computer program product, wherein any feature mentioned in one claim category, e.g., method, can be claimed in another claim category, e.g., system, as well. The dependencies or references back in the attached claims are chosen for formal reasons only. However any subject matter resulting from a deliberate reference back to any previous claims (in particular multiple dependencies) can be claimed as well, so that any combination of claims and the features thereof are disclosed and can be claimed regardless of the dependencies chosen in the attached claims. The subject-matter which can be claimed comprises not only the combinations of features as set out in the attached claims but also any other combination of features in the claims, wherein each feature mentioned in the claims can be combined with any other feature or combination of other features in the claims. Furthermore, any of the embodiments and features described or depicted herein can be claimed in a separate claim or in any combination with any embodiment or feature described or depicted herein or with any of the features of the attached claims.

Reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

The invention claimed is:

1. A system comprising:
   a wafer-handling system of a semiconductor-manufacturing system, wherein the wafer-handling system is configured to hold one or more wafers for processing;
   a plurality of processing components configured to physically treat the one or more wafers;
   a controller configured to operate the plurality of processing components; and
   a text bot in communication with the semiconductor-manufacturing system and the plurality of processing components, the text bot configured to:
   receive metrology data from a subset of the plurality of processing components;
   link the metrology data to a performance of a processing component, which is not included in the subset of the plurality of processing components, in treating the one or more wafers;
   determine operating parameters for the processing component that optimizes the performance in treating the one or more wafers based on the metrology data; and
   respond to a user inquiry, wherein the response comprises the operating parameters, and
   wherein a wafer is treated based on the operating parameters.

2. The system of claim 1, wherein the user inquiry is a spoken user inquiry.

3. A system comprising:
   a wafer-handling system of a semiconductor-manufacturing system, wherein the wafer-handling system is configured to hold one or more wafers for processing;
   a plurality of processing components configured to physically treat the one or more wafers;
   a controller configured to operate the plurality of processing components; and
   a speech bot in communication with the semiconductor-manufacturing system and the plurality of processing components, the speech bot configured to:
   receive metrology data from a subset of the plurality of processing components;
   link the metrology data to a performance of a processing component, which is not included in the subset of the plurality of processing components, in treating the one or more wafers;
   determine operating parameters for the processing component that optimizes the performance in treating the one or more wafers based on the metrology data; and
   respond to a spoken user inquiry, wherein the response comprises the operating parameters, and wherein the speech bot is further configured to access the controller and operate processing components based on user-response input.

4. A system comprising:
   a wafer-handling system of a semiconductor-manufacturing system, wherein the wafer-handling system is configured to hold one or more wafers for processing;
   a plurality of processing components configured to physically treat the one or more wafers;
   a controller configured to operate the plurality of processing components; and
   an artificial intelligence (AI) engine in communication with the semiconductor-manufacturing system and the plurality of processing components, wherein the AI engine is configured to:
   receive metrology data from a subset of the plurality of processing components;
   link the metrology data to a performance of a processing component, which is not included in the subset of the plurality of processing components, in treating the one or more wafers;
   determine operating parameters for the processing component that optimizes the performance in treating the one or more wafers based on the metrology data; and
   respond to a user inquiry, wherein the response comprises the operating para meters, and
   wherein a wafer is treated based on the operating parameters.

5. A system comprising:
   a wafer-handling system of a semiconductor-manufacturing system, wherein the wafer-handling system is configured to hold one or more wafers for processing;
   a plurality of processing components configured to physically treat the one or more wafers;
   a controller configured to operate the plurality of processing components; and
   a natural language processing (NLP) bot in communication with the semiconductor-manufacturing system and the plurality of processing components, the NLP bot is configured to:
   receive metrology data from a subset of the plurality of processing components;
   link the metrology data to a performance of a processing component, which is not included in the subset of the plurality of processing components, in treating the one or more wafers;
   determine operating parameters for the processing component that optimizes the performance in treating the one or more wafers based on the metrology data; and
   respond to a user inquiry, wherein the response comprises the operating parameters, and
   wherein a wafer is treated based on the operating parameters.

6. A system comprising:
   a wafer-handling system of a semiconductor-manufacturing system, wherein the wafer-handling system is configured to hold one or more wafers for processing;
   a plurality of processing components configured to physically treat the one or more wafers;
   a controller configured to operate the plurality of processing components; and
   a conversational bot in communication with the semiconductor-manufacturing system and the plurality of processing components, wherein the conversational bot is configured to:
      receive metrology data from a subset of the plurality of processing components;
      link the metrology data to a performance of a processing component, which is not included in the subset of the plurality of processing components, in treating the one or more wafers;
      determine operating parameters for the processing component that optimizes the performance in treating the one or more wafers based on the metrology data; and
      respond to a user inquiry, wherein the response comprises the operating parameters, and
   wherein a wafer is treated based on the operating parameters.

7. The system of claim 6, wherein the conversational bot is configured to provide a contextual response with multiple answers to the user inquiry.

8. The system of claim 6, wherein:
   the user inquiry is associated with a trouble-shooting problem; and
   the conversational bot is configured to provide to respond to the user inquiry based on one or more of:
      a decision-making logical path analysis of historical logs;
      best known methods; or
      trouble-shooting decision-making-tree guides.

9. The system of claim 6, further comprising augmented reality (AR) wearable equipment in communication with the conversational bot, wherein the AR wearable equipment is configured to transmit the user inquiry to the conversational bot and receive response data.

10. The system of claim 9, further comprising virtual reality (VR) wearable equipment in communication with the conversational bot and the AR wearable equipment, wherein the VR wearable equipment is configured to transmit the user inquiry to the conversational bot and receive response data.

11. The system of claim 6, further comprising virtual reality (VR) wearable equipment in communication with the conversational bot, wherein the VR wearable equipment is configured to transmit the user inquiry to the conversational bot and receive response data.

12. The system of claim 6, further comprising user-wearable equipment in communication with the conversational bot, wherein the user-wearable equipment is configured to transmit the user inquiry to the conversational bot and receive response data.

13. The system of claim 12, wherein the user-wearable equipment comprises a microphone and a speaker.

14. The system of claim 13, wherein the user-wearable equipment comprises a display configured to display video clips in response to the user inquiry to the conversational bot.

15. The system of claim 14, wherein the user-wearable equipment comprises a camera configured to record video and transmit the video to a remote display.

16. A system comprising:
   a semiconductor-manufacturing system comprising a plurality of wafer processing tools configured to physically treat a wafer;
   a process-data store that comprises tool data that is extracted and transformed from operation manuals corresponding to each of the plurality of wafer processing tools; and
   an artificial intelligence (AI) engine in communication with the plurality of wafer processing tools, wherein the AI engine:
      has access to the process-data store;
      receives sensor and metrology data from a subset of the plurality of wafer processing tools; and
      is configured to monitor operation of a wafer processing tool that is not part of the subset of wafer processing tools; predict failure conditions of the wafer processing tool based on the sensor and metrology data and the tool data; and recommend actions for wafer processing tool maintenance to optimize uptime, wherein wafer processing tool is operated based on the recommended actions.

17. The system of claim 16, wherein the AI engine is further configured to provide recommended tool-operation parameters configured to increase device yield compared with observed tool operation parameters.

18. A system comprising:
   a semiconductor-manufacturing system comprising a plurality of wafer processing tools configured to physically treat a wafer;
   a process-data store that comprises tool data that is extracted and transformed from operation manuals corresponding to each of the plurality of wafer processing tools; and
   an artificial intelligence (AI) engine in communication with the plurality of wafer processing tools, wherein the AI engine:
      has access to the process-data store;
      receives sensor and metrology data from a subset of the plurality of wafer processing tools; and
      is configured to monitor operation of a wafer processing tool that is not part of the subset of wafer processing tools and recommend actions for the wafer processing tool based on the sensor and metrology data and the tool data, the recommended actions determined to improve yield,
   wherein one or more wafers are treated based on the recommended actions.

19. A system comprising:
   a plurality of processing components configured to physically treat of one or more semiconductor wafers;
   a controller configured to operate the plurality of processing components; and
   a conversational bot configured to:
      receive metrology data from a subset of the plurality of processing components;
      link the metrology data to a performance of a processing component, which is not included in the subset of the plurality of processing components, in treating the one or more wafers;
      determine operating parameters for the processing component that optimizes the performance in treating the one or more wafers based on the metrology data; and respond to a user inquiry, wherein the response comprises the operating parameters, and
wherein a wafer is treated based on the operating parameters.

20. The system of claim 19, wherein the conversational bot is further configured to initiate treatment of one or more of the semiconductor wafers based on one or more of:
user input; or
accessed best known methods.

* * * * *